United States Patent [19]

Aström

[11] Patent Number: 5,056,616

[45] Date of Patent: Oct. 15, 1991

[54] LOUDSPEAKER

[76] Inventor: Thomas Aström, Kebnekaisevägen 9, S-161 33 Bromma, Sweden

[21] Appl. No.: 465,110

[22] PCT Filed: Aug. 22, 1988

[86] PCT No.: PCT/SE88/00428

§ 371 Date: Apr. 19, 1990

§ 102(e) Date: Apr. 19, 1990

[87] PCT Pub. No.: WO89/01728

PCT Pub. Date: Feb. 23, 1989

[51] Int. Cl.⁵ .......... H05K 5/00

[52] U.S. Cl. .......... 181/156

[58] Field of Search .......... 181/150, 155, 156, 199, 181/154

[56] References Cited

U.S. PATENT DOCUMENTS

| | | | |
|---|---|---|---|
| 2,670,053 | 2/1954 | Doms | 181/199 |
| 2,718,932 | 9/1955 | Benjamin | 181/155 |
| 3,122,214 | 2/1964 | Robbins | 181/155 |
| 3,938,617 | 2/1976 | Forbes | 181/155 |
| 4,131,179 | 12/1978 | Pope | 181/156 |

*Primary Examiner*—Brian W. Brown
*Attorney, Agent, or Firm*—Townsend and Townsend

[57] ABSTRACT

A loudspeaker of the present invention includes a loudspeaker cabinet and at least one loudspeaker element having a loudspeaker membrane. A plurality of sound passages define a cavity in a wall of the cabinet, and each sound passage terminates on one end in a proximal aperture acoustically coupled to the loudspeaker element and on the other end in a distal aperture acoustically coupled with exterior surrounding of the cabinet. In this way, the loudspeaker membrane is acoustically coupled with the exterior surroundings of the cabinet. The distal aperture of a one sound passage communicates with a distal aperture of another sound passage, and the sectional area of the distal aperture of the first sound passage is different from the distal aperture of the second sound passage. The first and second sound passages have different lengths.

23 Claims, 6 Drawing Sheets

LOUDSPEAKER

Figure 1:
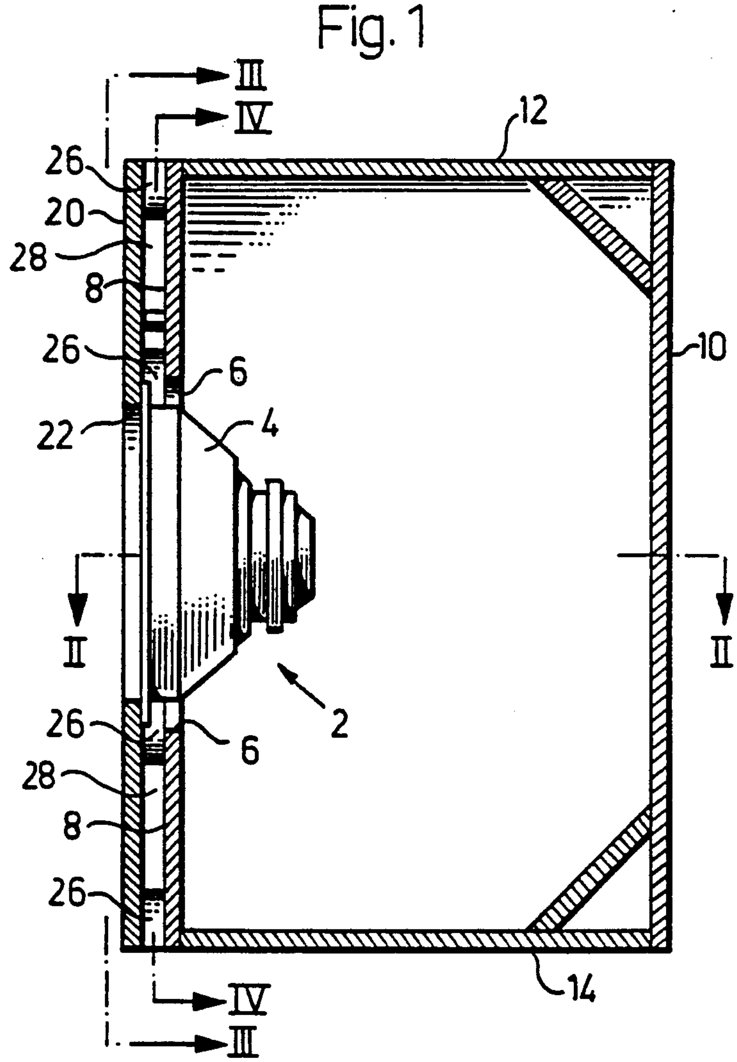

The present invention relates to a loudspeaker comprising a loudspeaker cabinet or box with at least one loudspeaker element provided with a loudspeaker membrane means, and with a sound passage arrangement which in association with a wall of the cabinet defines a cavity which via apertures is acoustically coupled with the membrane means and with the surroundings of the cabinet.

The principles on which today reproduction of low frequencies of music is based, have existed in approximately 20 years. Within the area of electronics, on the other hand, there has recently been an enormous development. The new CD players thus have their best properties in the bass region. The loudspeakers are therefore the most limiting factor in today's bass reproduction.

The object of the invention has been to provide a loudspeaker design which more fulfils today's requirements on bass reproduction and simpler tuning of the loudspeaker system.

This object has been attained in that, in the loudspeaker according to the invention, one of the apertures communicates with other ones of the apertures via sound passages, the sectional area of which varies from the first mentioned aperture to the other apertures, and in that at least two of the sound passages have mutually different lengths.

The invention can be stated to be based on the so called Helmholtz-resonator and can therefore be regarded as a further development of the conventional bass reflex loudspeaker.

More in detail the invention in a practical case can involve the following.

In front of an aperture or opening in a loudspeaker cabinet an outer baffle is mounted on a small distance from the otherwise closed cabinet. The loudspeaker element can be mounted in the outer baffle via the opening, or in a wall at a distance from the opening, e.g. the same wall as the opening wall, but outside the area of the baffle. Between the cabinet and this outer baffle there is thereby formed a cavity in the form of a narrow gap from the opening to the outer edge of the baffle. In this outer edge there are a number of small side apertures through which the sound can pass. The sound thus passes outwardly partly through the side apertures and partly through the loudspeaker membrane. Tuning is carried through by varying the distance between the box wall and the baffle and by varying the width, depth, length, and location of the side apertures with respect to the opening.

By locating the small side apertures on different distances from the opening the frequency response becomes very uniform. No blowing sounds (air noises) appear since the sound channel from the opening to the side apertures has a varying sectional area. Thereby a linear impedance transformation is obtained between the inner of the cabinet and the surroundings.

The impedance curve of the loudspeaker system becomes uniform without great variations and the loudspeaker membrane deflections become very moderate, also at the lowest frequencies.

The power capacity of the loudspeaker is increased at the same time as it requires less power to be able to produce a high sound pressure at low frequencies, and the cabinet volume can be made smaller as compared with known technique.

Due to the fact that the side apertures are distributed on different distances from the opening a very smooth frequency response can be obtained, as mentioned, down to the lowest spectrum around 20 Hz. The different distances to the side apertures furthermore results in the Q-value of the Helmholtz-resonance being low. This together with the smooth impedance curve results in a very good transient reproduction and low distortion also at very low frequencies.

Despite of the low Q-value of this resonator design an increase of the efficiency of 10 to 12 dB can be obtained in the lowest bass, as compared with a loudspeaker according to "the closed box" principle. This is possible due to the fact that the resonator action has here been provided in two steps. First the sound is conducted from the inner of the cabinet via the opening to the gap cavity. From this small volume the sound then passes through the side apertures with a certain depth, before reaching the listening room.

Due to the fact the side apertures emit sounds in different directions the negative influence of the room on the bass reproduction is reduced. When usual bass reflex loudspeakers are used, the room resonances are often activated which can be very disturbing. Contrary thereto the invention provides a certain fade out of the natural resonances of the room by means of the homogenous sound field that is formed. This gives a very pure and homogenous bass reproduction. This is also a reason to the fact that a loudspeaker according to the invention goes very deep down into the lower bass with a pure and uncoloured reproduction.

Figure 2:
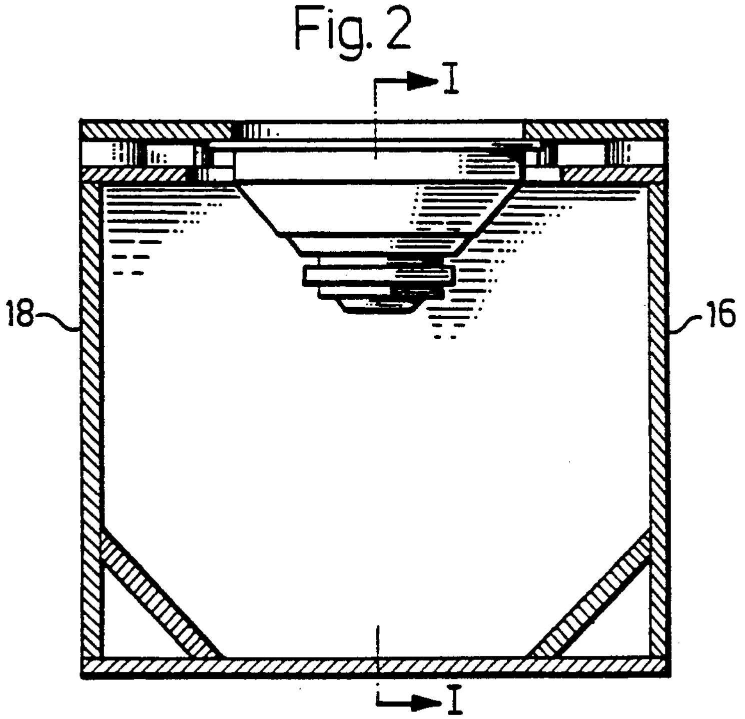
Figure 3:
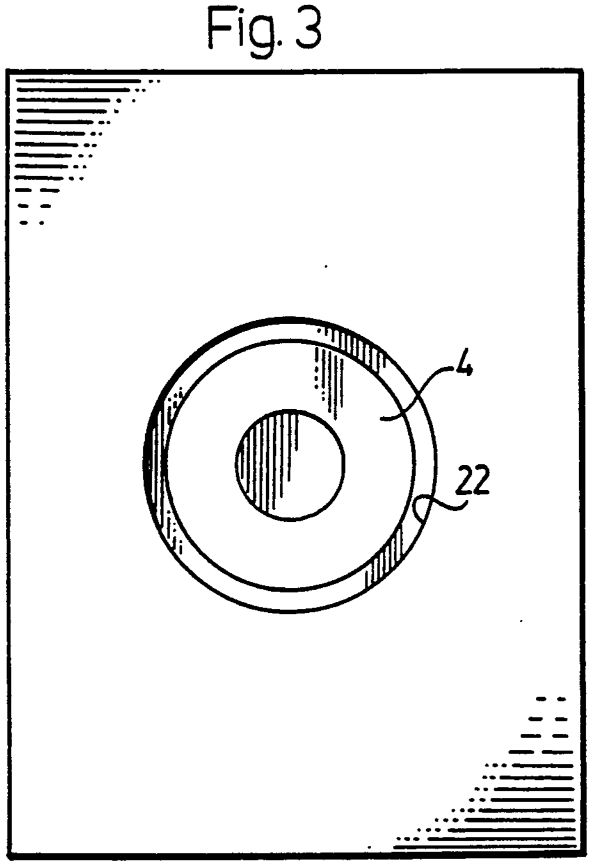
Figure 4:
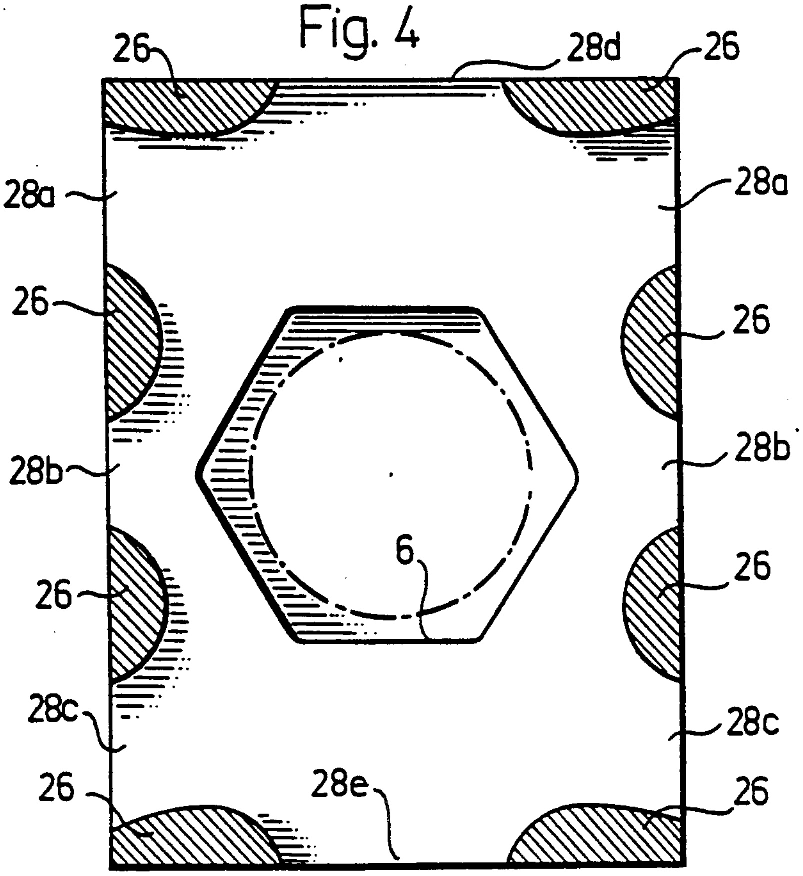
Figure 5:
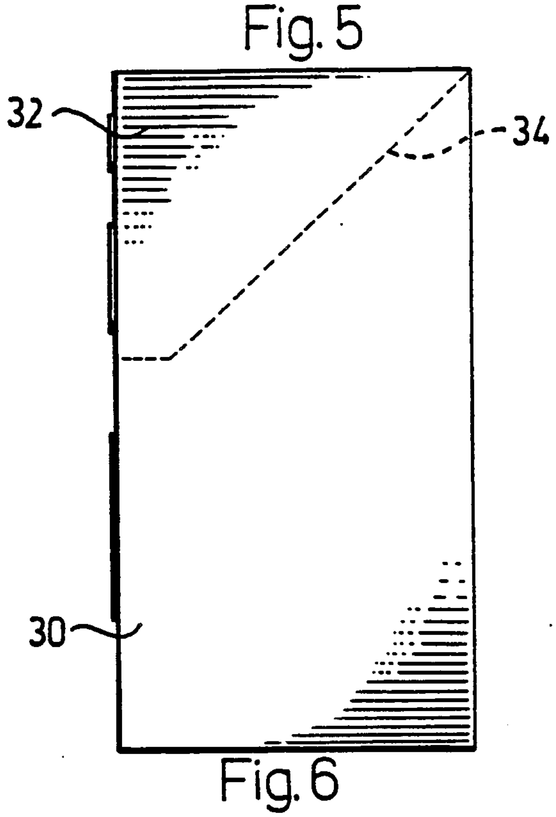
Figure 6:
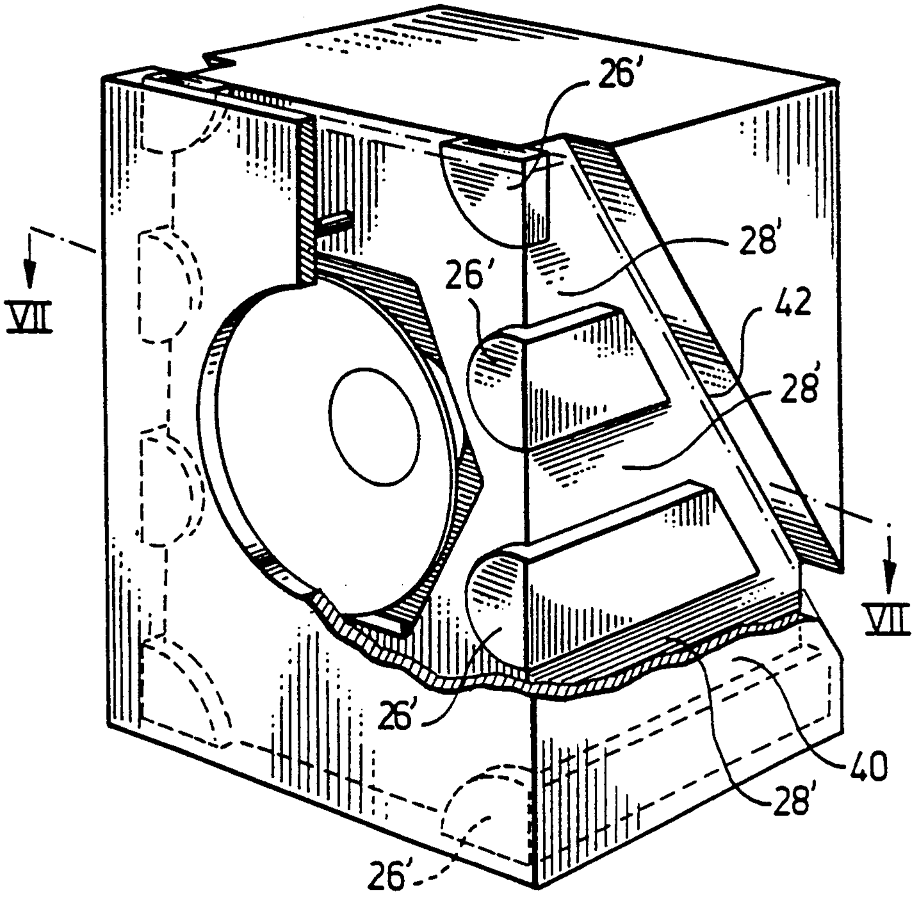
Figure 7:
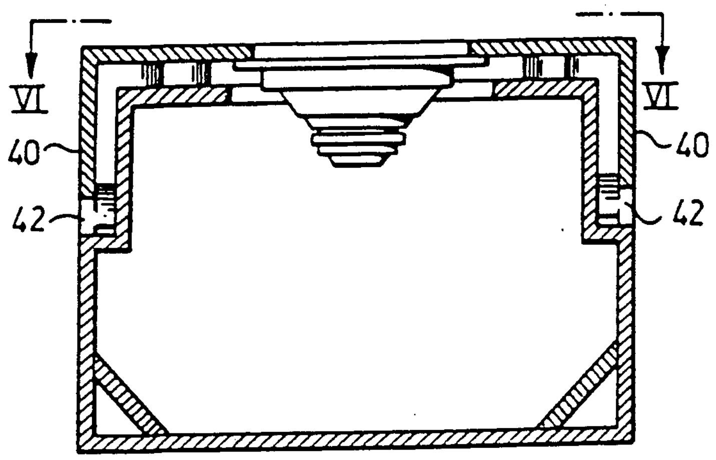
Figure 8:
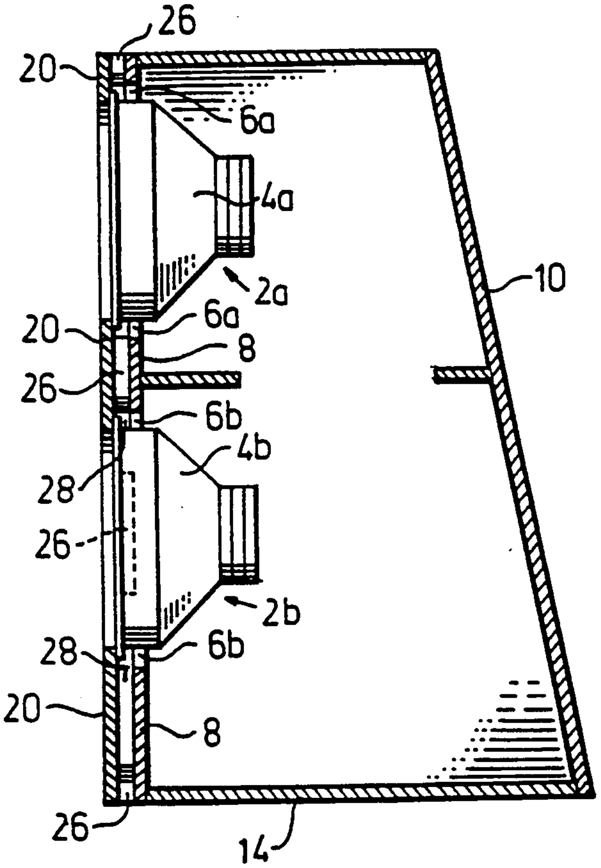
Figure 9:
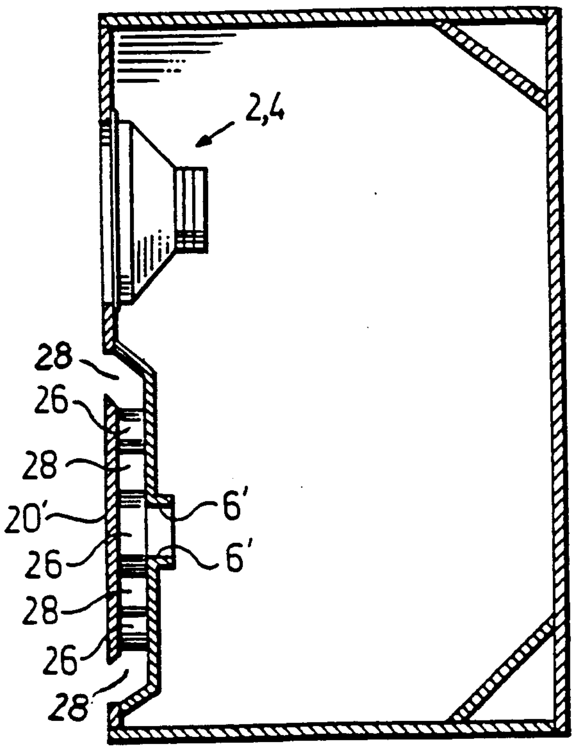
Figure 10:
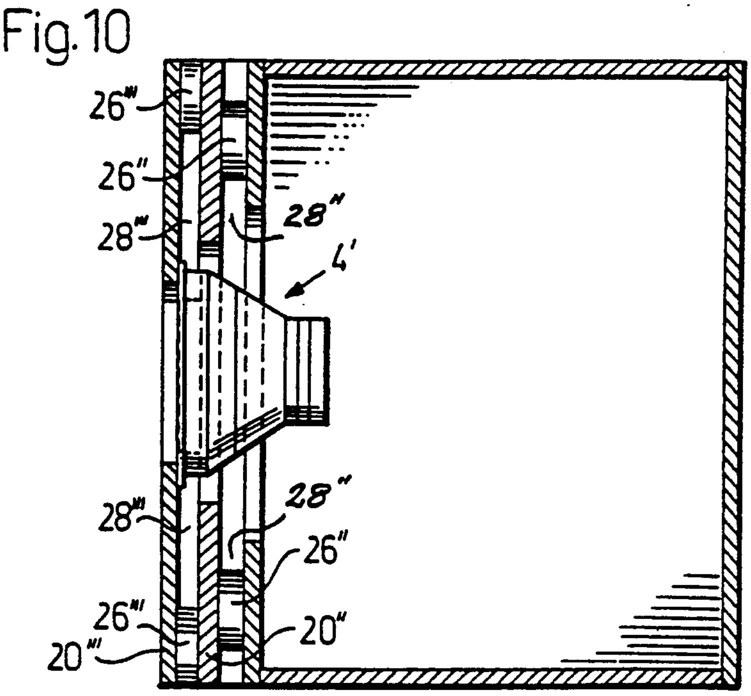

The invention shall now be described more closely below with reference to the attached drawings, on which FIG. 1 shows a vertical section in the direction of arrows I—I in FIG. 2, of a loudspeaker according to one embodiment of the invention, FIG. 2 shows a horizontal section through the same loudspeaker in the direction of arrows II—II in FIG. 1, FIG. 3 shows a front view in the direction of arrows III—III in FIG. 1 of the same loudspeaker, FIG. 4 shows a section in the direction of arrows IV—IV in FIG. 1, without the loudspeaker element, FIG. 5 is a schematic side view of a loudspeaker arrangement including a loudspeaker according to the invention, FIG. 6 is a perspective view, partly in section, along the line VI—VI in FIG. 7, of another embodiment of the loudspeaker of the invention, FIG. 7 is a horizontal section in the direction of arrow VII in FIG. 6 of this loudspeaker, FIGS. 8, 9 and 10 show three further loudspeaker according to the invention, in section through the loudspeaker cabinet.

Figure 11:
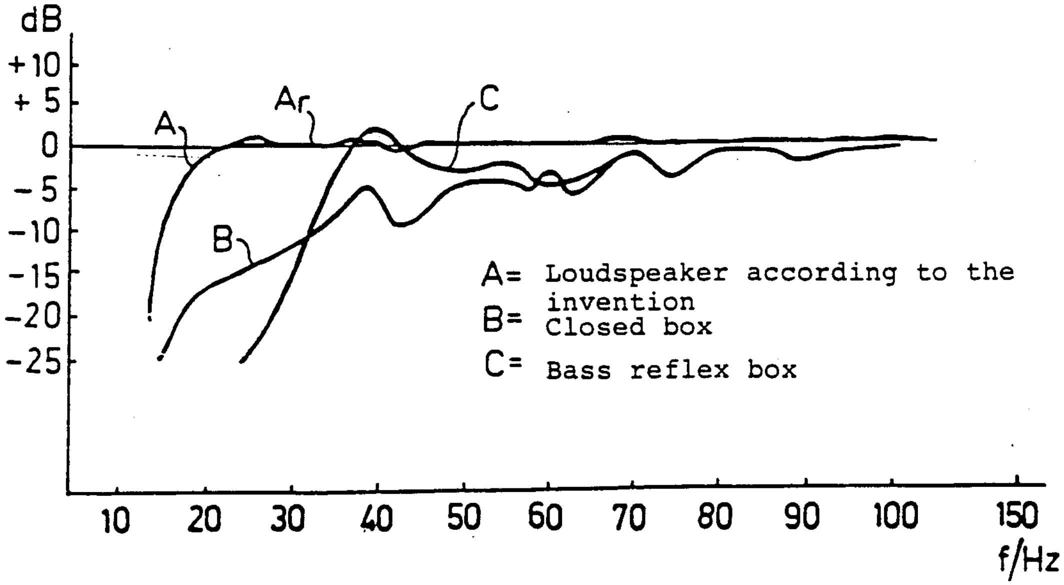
Figure 12A:
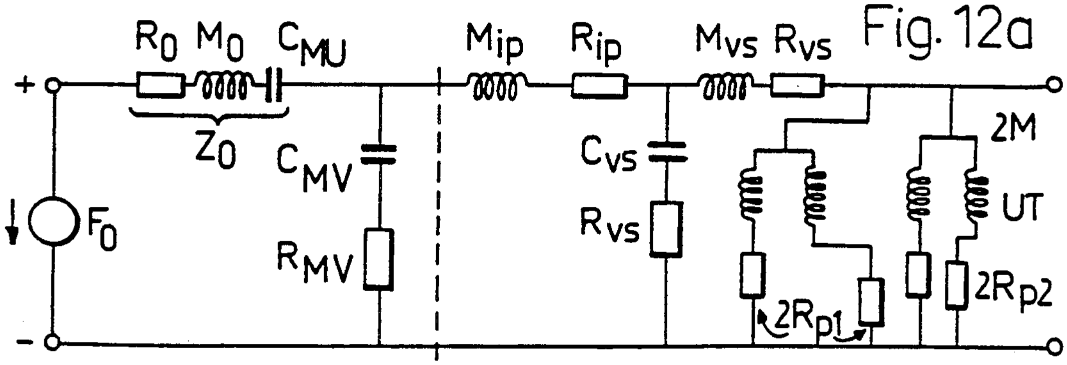
Figure 12B:
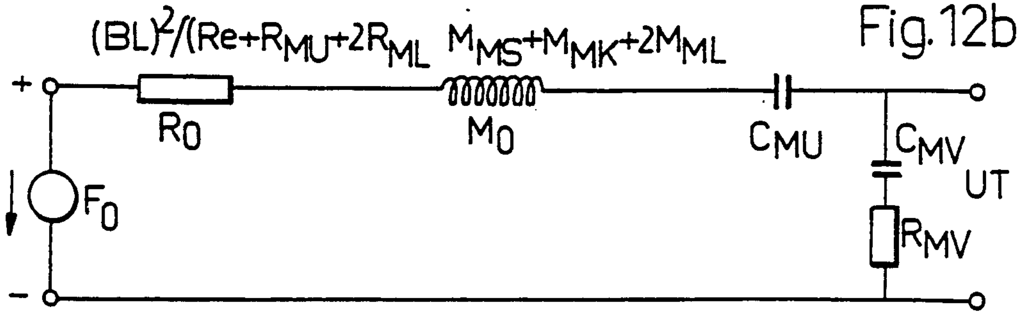
Figure 12C:
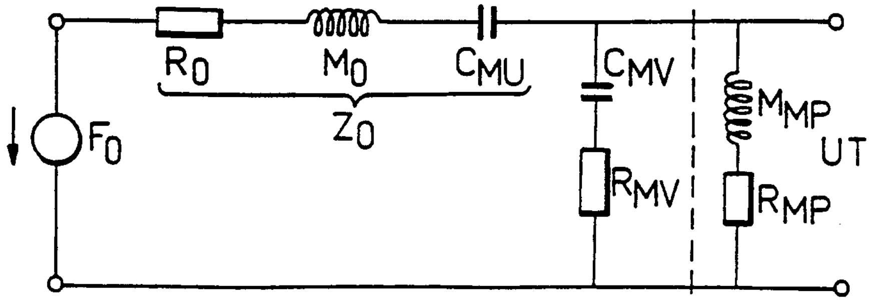

FIG. 11 illustrates frequency response curves of a loudspeaker according to the invention and according to two prior loudspeaker designs, and FIGS. 12*a–c* show equivalent diagrams of the loudspeaker designs of FIG. 11.

It should be emphasized that the drawings only illustrate the invention schematically and without demands for correct proportions between different dimensions.

FIGS. 1–4 illustrate a first embodiment of a loudspeaker according to the invention. It includes a loudspeaker element 2 of the electrodynamic type with a loudspeaker membrane in the form of a cone 4 which extends through an opening or passage 6 in a fore wall 8 of a loudspeaker cabinet. The loudspeaker cabinet has a rear wall 10. Between the fore wall 8 and the rear wall 10 upper and lower walls 12 and 14, respectively, and sidewalls 16 and 18, respectively, extend.

The loudspeaker element 2 is carried by a baffle 20 arranged in front of the wall 8, such that the front side of the cone is separated from the inner of the cabinet. The rear side of the cone has good contact with the inner of the cabinet and with the gap between the baffle 20 and the wall 8. More particularly, the loudspeaker element 2 is here mounted on the side of the baffle 20 facing the cabinet, in association with a loudspeaker opening 22 arranged in the baffle. The baffle 20 is mounted at the wall 8 at a distance from it that can be of an order of magnitude of 8–25 mm depending upon the size of the cabinet. The opening 6 is preferably of an order of magnitude of 10–30% greater than the opening 22, or the greatest cone diameter.

Between the wall 8 and the baffle 20, along the outer edges thereof, sound barrier elements 26 are arranged. The wall 8, the baffle 20 and the sound barrier elements 26 define a number of gap apertures 28*a–e*. The dimensions of the wall 8 and the baffle 20 and the shapes and localization of the sound barriers 26 have been so adapted that the mean distance from the loudspeaker cone, extending through the opening 22, to the respective gap apertures 28*a–e* is different according to a predetermined pattern. In the illustrated embodiment the mean distances to the apertures 28*a* and 28*c* is the same, but differ from the mutually similar mean distances to the gap apertures 28*b*. The mean distances to the gap apertures 28*d* and 28*e* are mutually similar but differ from the other mean distances. Other distributions of the mean distances are, however, also possible in accordance with discussions below. The number of gap apertures should be at least 3, preferably at least 4, and most preferably more. As appears the gap apertures have their mouths along the opening wall 8, more particularly at the edge thereof in the embodiment shown. As furthermore should have appeared from the above, the cavity in the form of a gap arrangement defined by the wall 8, the baffle 20 and the sound barrier elements 26 includes a number of sound passages passing between the loudspeaker cone and one each of the gap apertures 28*a–e*. The sound passages can be separated but it is essential that they communicate with each other as appears from FIG. 4. Furthermore their section for sound passage from the opening 6 to the apertures 28*a–e* varies, as appears. Through the described loudspeaker design the range of frequencies can be extended considerably downwards.

The essential thing is that a cavity, here an air gap, is obtained between the wall 8 and baffle 20, with different distances between the loudspeaker cone and the gap apertures. The sound passes out partly forwardly through the loudspeaker element and partly through these gap apertures.

Due to the fact that the gap apertures 28*a–e* are located on different mean distances from the loudspeaker cone a narrow resonance peak is avoided. Instead a broad flattened resonance of the kind shown at $A_r$ of the curve A in FIG. 11 is obtained. This resonance $A_r$ is responsible for the increase of the frequency curve, as compared with a "closed box".

Due to the fact that the loudspeaker 4 is located in direct association with the gap between the wall 8 and the baffle 20 a very small time delay is obtained between the discharge of sound from the loudspeaker element proper and the gap apertures 28*e*. This gives a considerably better transient response as compared with the conventional bass reflex system, where the time delay is greater.

As shown in FIG. 4 the hole 6 for the loudspeaker cone is hexagonal. Although other forms of this hole are well usable for a loudspeaker design according to the invention a particularly good coupling to the volume of the loudspeaker cabinet is obtained through the hexagonal shape.

By means of the loudspeaker design according to the invention the frequency response in the bass register can be controlled in a very simple way. More particularly, the frequency curve is controlled by moving the sound barrier elements, such as those shown at 26 in FIG. 4, in such a way that the mean distance to the respective gap aperture is changed. A short distance to the gap aperture implies a higher frequency whereas the frequency sinks as the distance increases. In the embodiment described with reference to FIGS. 1–4, the highest frequencies are thus obtained in a direction sidewardly outwardly, whereas the lowest frequencies are obtained in a direction upwards and downwards from the loudspeaker. As has appeared the frequency curve at the embodiment shown is thus determined by the distance between the loudspeaker cone and the gap apertures, the length and localization of the sound barriers, but also of the distance between the baffle and the main box, and the size and depth of the inner opening.

The cavity associated with the woofer according to the invention must be delimited from speaker membranes in other registers in a complete loudspeaker arrangement with all registers. An example of this is shown schematically in FIG. 5 where the volume designated 30 of the cabinet according to the invention is separated from the volume 32 for speaker elements in other registers through an oblique separating wall 34.

When dimensioning the loudspeaker according to the invention at the lowermost frequencies the loudspeaker system shall be tuned to different frequencies which are determined by the mean distances from the opening facing the cavity of the cabinet to the gap apertures and which essentially lie below the resonance frequency of a corresponding closed cabinet. In this connection also the added length of the gap apertures around the circumference of the baffle is essentially smaller than said circumference, preferably less than 50% thereof. As mentioned above the sound barrier elements shall be shaped so that the air flow therealong is maintained laminar to the greatest possible extent.

FIGS. 6 and 7 show an embodiment which is particularly suitable for smaller loudspeaker models. A number of the gap apertures here have their mouth outside the front wall of the loudspeaker, on one or more of the other walls of the loudspeaker cabinet. More particularly, the baffle 20 here continues along the connected cabinet sides with baffle portions 40, which are countersunk arranged in the corresponding cabinet side in the way appearing from FIG. 7, the edges of the baffle portions 40 then, as appearing from FIG. 6, extending under an angle with respect to the front side of the enclosure, whereby the length of the gap between the baffle portion 40 and the corresponding cabinet side will vary up to the common gap opening 42 having its mouth in the cabinet side. The sound barriers, here designated 26′, then extend between the front side of the enclosure and the common gap opening 42 so that sound passages of different length along the cabinet side are obtained between the sound barriers up to the respective gap apertures 28' ending in the common gap opening. The length and form of the sound barrier can also here be varied so that they have a greater or smaller extension towards the loudspeaker cone, e.g. in one case begin at the cone, and in another case begin not until on the connected cabinet side.

Although, in the embodiment according to FIGS. 6 and 7, the upwards and downwards directed sound passages end at the edge of the front side of the cabinet, such as at the embodiment according to FIGS. 1–4, it would also be concievable to let the baffle continue on the top and bottom sides in the same way as has been described above for the baffle portions 40. The corners within the sound passages up to the gap apertures 28' can also be bevelled for avoiding reflections.

The invention can also be used with more loudspeaker elements in the bass register. Then the volume of the loudspeaker cabinet can be common to the loudspeaker elements. FIG. 8 shows such an embodiment with two loudspeaker elements.

The loudspeaker elements 4*a* and 4*b* located in the same volume form a common system at tuning to different frequencies.

The system with more than one loudspeaker element can be used for spreading the resonance frequencies, by locating the loudspeaker elements on different distances from the respective gap apertures.

If more loudspeaker elements are used in separate volumes they can be tuned mutually independently.

In FIG. 9 a further embodiment of the invention is shown.

Characterizing for this embodiment is that the baffle and the sound passages cooperating therewith do not surround the loudspeaker element as in the earlier embodiments.

The correspondence to the opening 6 in the earlier embodiments has been designated 6' in FIG. 9. The opening 6' can, however, here be smaller than the cone diameter. In the same way the element corresponding to the baffle has here been designated 20'.

The loudspeaker element 2 and the baffle 20' with the associated sound passages, which are defined by the details 6' and 20' and sound barrier elements are arranged vertically above each other in the same wall of the cabinet.

In a modification of the embodiment according to FIG. 9 the loud speaker element can be arranged in a wall of a box and two sets of gap apertures defined by sound barrier elements can be arranged in one wall each of the cabinet, connecting to the wall including the loudspeaker element.

In the embodiment shown in FIG. 10 there are used in association with the loudspeaker element 4' two baffle means 20'' and 20''' arranged in parallel to each other and having sound barrier elements 26'' and 26''', respectively, and gap apertures 28'' and 28''', respectively. With this arrangement a very exact tuning of the system can be obtained.

According to a further embodiment the earlier embodiments can be supplemented with a material of the type known under the designation Polytex that partly fills the sound passages.

FIG. 11 shows graphs over the frequency response of a loudspeaker according to the invention and two prior enclosure designs, viz. one in accordance with the "closed box" principle and one bass reflex cabinet. The graph illustrates that what has already been described and discussed above.

As an alternative illustration of the invention the equivalent diagrams for the respective cabinet designs in FIG. 11 are given in FIGS. 12*a–c*. FIGS. 12*a–c* thus correspond to an embodiment according to the invention, a design of the type "closed box", and a bass reflex cabinet, respectively. For the designations used in FIGS. 12*a–c* explanations are given below.

| | | | |
|---|---|---|---|
| | Loud-speaker element: | | |
| $U$ = | driving voltage | $F_o$ = | driving force |
| $BL$ = | force factor | $R_o$ = | total resistive portion. |
| $RE$ = | DC-resistance | $M_o$ = | total oscillating mass. |
| $R_{MU}$ = | resistive portion of the suspension | $Z_o$ = | total impedance. |
| $R_{ML}$ = | resistance of the co-oscillating air. | | |
| $M_{MS}$ = | mech. mass of the voice coil. | | |
| $M_{Mk}$ = | mech. mass of the oscillating cone. | | |
| $M_{ML}$ = | co-oscillating air mass. | | |
| $C_{MU}$ = | the mech. compliance of the diaphragm suspension. | | |
| | "Closed box": | | |
| $C_{MV}$ = | enclosure compliance. | | |
| $R_{MV}$ = | resistive losses of the box. | | |
| | Bass reflex cabinet: | | |
| $M_{MP}$ = | mech. oscillating air mass of the port duct. | | |
| $R_{MP}$ = | resistive losses of the port duct. | | |
| | The invention: | | |
| $M_{ip}$ = | mech. oscillating mass between the gap system and the cabinet volume. | | |
| $C_{vs}$ = | mech. compliance of the gap volume. | | |
| $R_{ip}$ = | resistive processes in the passage between the cabinet volume and the gap system. | | |
| $R_{vs}$ = | resistive processes in the gap system. | | |
| $M_{vs}$ = | mech. oscillating mass in the gap system. | | |
| $R_{VS}$ = | resistive process in the gap system. | | |
| $M_{Pi}$ = | mech. oscillating mass in gap aperture No. i, i = 1, 2, 3. | | |
| $R_{Pi}$ = | resistive processes in gap aperture No. i, i = 1, 2, 3. | | |

Although the expression "gap apertures" has been used above for the described embodiments in order todesignate sidewardly directed apertures from the gap cavity it is also conceivable, while maintaining the inventive effect, to replace these apertures completely or partly with apertures extending through the baffle.

In embodiments where loudspeaker elements and baffle means are separated, cf. FIG. 9, it would also be conceivable to locate the baffle on the inside of the corresponding cabinet wall, while principally maintaining the mutual arrangements of the baffle and the wall, as they have been described in the above embodiments.

The expressions baffle and baffle means used in the above description and in the claims are used in a customary way to designate a sound shield used within the loudspeaker art (cf. e.g. Svensk Teknisk Ordbok 1946). Although the baffle on the drawings is illustrated as having a flat shape, also other shapes are conceivable for defining the cavity with the sound passages between loudspeaker cone and gap apertures.

For the different parts and elements of the loudspeaker devices described above materials conventional within the loudspeaker art can be used.

I claim:

1. A loudspeaker comprising:

a loudspeaker cabinet having an interior and an exterior, at least one loudspeaker element having a loudspeaker membrane, and a plurality of sound passages defining a cavity in a cabinet wall, each sound passage terminating on one end in a proximal aperture acoustically coupled to said loudspeaker element and on the other end in a distal aperture acoustically coupled with exterior surroundings of the cabinet, whereby said loudspeaker membrane is acoustically coupled with the exterior surroundings of the cabinet, the distal aperture of a first sound passage communicating with a distal aperture of a second sound passage, the sectional area of the distal aperture of said first sound passage being different from the sectional area of the distal aperture of said second sound passage, and said first and second sound passages having different lengths.

2. The loudspeaker of claim 1, wherein the sectional area of each sound passage essentially increases from the proximal aperture to the distal aperture.

3. The loudspeaker of claim 1, wherein said cabinet wall comprises an inner wall and a baffle, said cavity being defined between the interior wall and said baffle, wherein at least two of said distal apertures are arranged at different distances from an opening defined in said inner wall, and wherein the sectional area of each sound passage increases radially toward the distal aperture.

4. The loudspeaker of claim 3, wherein the loudspeaker element is located in an opening defined in said inner wall and is mounted in an opening defined in the baffle.

5. The loudspeaker of claim 3, wherein an edge of said opening defined in said inner wall is separated from the loudspeaker element.

6. The loudspeaker of claim 5, wherein the loudspeaker element is arranged in the same cabinet wall as the opening defined in said inner wall.

7. The loudspeaker of claim 5, wherein the loudspeaker element is arranged in a different cabinet wall than said cabinet wall.

8. The loudspeaker of claim 3, wherein at least one of the distal apertures ends along the cabinet wall.

9. The loudspeaker of claim 8, wherein at least one of the distal apertures ends at an edge of the inner wall.

10. The loudspeaker of claim 3, wherein at least one of the distal apertures ends outside the inner wall.

11. The loudspeaker of claim 7, wherein at least one of said sound passages continues along another cabinet wall of the loudspeaker cabinet.

12. The loudspeaker of claim 3, wherein said sound passages extend between the opening defined in said inner wall and respective distal openings and are at least partly separated from each other.

13. The loudspeaker of claim 3, wherein said sound passages are formed between the inner wall and said baffle, wherein said baffle is mounted at a distance from the inner wall, said distal apertures being defined by sound barriers disposed between the inner wall and the baffle.

14. The loudspeaker of claim 13, further comprising:

a second cabinet wall having a second inner wall and a second baffle, the first and second baffles being continuous along the two cabinet walls, and second sound barriers disposed between said second inner wall and said second baffle which define at least one sound passage and distal aperture.

15. The loudspeaker of claim 14, wherein said first and second baffles are connected at an edge and are disposed an angle with further edges of the cabinet side.

16. The loudspeaker of claim 14, wherein at least one of the sound barriers in said second cabinet wall begins with a portion on the first inner wall and extends to the edge of the second baffle.

17. The loudspeaker of claim 14, wherein the second baffle is countersunk arranged in the second cabinet wall.

18. The loudspeaker of claim 1, wherein the sound passages include an inner baffle arranged on the interior of the cabinet of the loudspeaker.

19. The loudspeaker of claim 1, wherein the sound passages include a baffle through which at least one of the other apertures extends.

20. The loudspeaker of claim 1, wherein the sound passages include at least two baffles disposed in parallel to each other.

21. The loudspeaker of claim 1, wherein the sound passages are acoustically coupled with each other.

22. The loudspeaker of claim 3 for use in the lower bass register, wherein the added length of the sound passages around the circumference of the baffle is less than the circumference of the opening defined in said inner wall.

23. The loudspeaker of claim 22 wherein the added length of the sound passages is less than 50% of the circumference of the opening in said inner wall.

* * * * *